United States Patent

[11] 3,585,454

[72] Inventor John S. Roberts
Export, Pa.
[21] Appl. No. 811,866
[22] Filed Apr. 1, 1969
[45] Patented June 15, 1971
[73] Assignee Westinghouse Electric Corporation
Pittsburgh, Pa.

[54] CASE MEMBER FOR A LIGHT ACTIVATED SEMICONDUCTOR DEVICE
1 Claim, 3 Drawing Figs.

[52] U.S. Cl. .......... 317/234R, 317/235 R, 250/211, 250/227, 317/234 P, 317/234 G, 317/235 N
[51] Int. Cl. .......... H01l 3/00, H01l 5/00
[50] Field of Search .......... 317/234, 235, 6, 27; 250/211, 227

[56] References Cited

UNITED STATES PATENTS

| | | | |
|---|---|---|---|
| 3,423,594 | 1/1969 | Galopin | 317/234 |
| 3,465,266 | 9/1969 | Dixon | 317/235 X |
| 3,504,238 | 3/1970 | Carter | 317/234 |

FOREIGN PATENTS

| | | | |
|---|---|---|---|
| 954,740 | 4/1964 | Great Britain | 317/234 |
| 1,143,874 | 2/1969 | Great Britain | 317/234 |

*Primary Examiner*—John W. Huckert
*Assistant Examiner*—Andrew J. James
*Attorneys*—F. Shapoe and C. L. Menzemer

ABSTRACT: This disclosure relates to a new and novel encapsulating package for a light activated or light sensitive semiconductor device. The various problems associated with introducing light through the top or cap of the encapsulating case are overcome by introducing light through an aperture in the base member of the case.

CASE MEMBER FOR A LIGHT ACTIVATED SEMICONDUCTOR DEVICE

BACKGROUND OF THE INVENTION

1. Field of the Invention

This invention is in the field of light activated or light sensitive semiconductor devices and relates particularly to encapsulating cases for such devices and a method of introducing light into such cases.

2. Description of the Prior Art

A typical prior art light activated semiconductor device 10 is shown in FIG. 1. The device consists of a semiconductor element 12 enclosed within a case 14 which consists of a base 16 and a cap 18.

The semiconductor element consists of a wafer of semiconductor material 20, preferably silicon and metal electrical contacts 22 and 24. The wafer 20 may have two or more adjacent regions of opposite type conductivity depending on if the device 10 is a diode, transistor, or four or more region switch. For the purpose of explaining the prior art, and the present invention the wafer 12 will be considered to be a four region switch.

The two metal contacts 22 and 24 are soft soldered to the two emitter regions of the wafer 20.

The metal electrical contact 22 is in turn soft soldered to top surface 26 of flat portion 28 of the base 16. The base 16 also has a stud portion 30 which extends downward from bottom surface 32 of flat portion 28.

The cap portion 18 of the case 14 is welded to the periphery of the top surface 26 of flat portion 28, of the base 16 through a steel weld ring 34 and a metal member 36.

The cap 18 has an electrical insulating section 38 which electrically insulated metal top portion 38 of the cap from the base 16.

A metal cylindrical electrode 40, whose walls form an aperture which extends entirely through the electrode, has one end 44 soft soldered by layer 46 to metal electrical contact 24. Other end 48 extends outside of the cap 18 to facilitate making electrical contact to circuit components not shown.

The aperture 42 is suitable to receive a light pipe which transmits light to a base region in the wafer 20.

Devices of this prior art type have numerous shortcomings.

The use of soft solders limits the ability of the device to withstand repeated thermal cycling. The electrode 40 is held rigidly in place and therefore does not permit unstress thermal cycling of the device. These two factors combine to make it extremely difficult to achieve and maintain a hermetically sealed device, and the numerous solder joints are all potential sources of failure.

In addition, the necessity of having an aperture through the cap for the light pipe restricts the selection of a cap to just one type.

An object of the present invention is to provide a light activated semiconductor device, which can be readily hermetically sealed within a case.

Another object of the present invention is to provide a light activated semiconductor device which contains a minimum of solder joints.

A still further object of the present invention is to provide a light activated semiconductor device which can withstand repeated thermal cycling.

Other objects will, in part, be obvious and will, in part, appear hereinafter.

SUMMARY OF THE INVENTION

In accordance with the present invention and attainment of the foregoing objects, there is provided a light activated semiconductor device comprising a semiconductor element having at least two adjacent regions of opposite type semiconductivity hermetically sealed within a case, said case having a cap member and a base member, said cap member being joined to said base member to provide a hermetic enclosure for said semiconductor element, the walls of said base member forming an aperture extending entirely therethrough, and means for conducting light from a source outside said hermetically sealed case through said aperture to a preselected region of said semiconductor device.

BRIEF DESCRIPTION OF THE DRAWING

For a better understanding of the nature and objects of the invention, reference should be had to the following detailed description and drawings, in which.

DESCRIPTION OF THE PREFERRED EMBODIMENT

Figures 1, 2, 3:
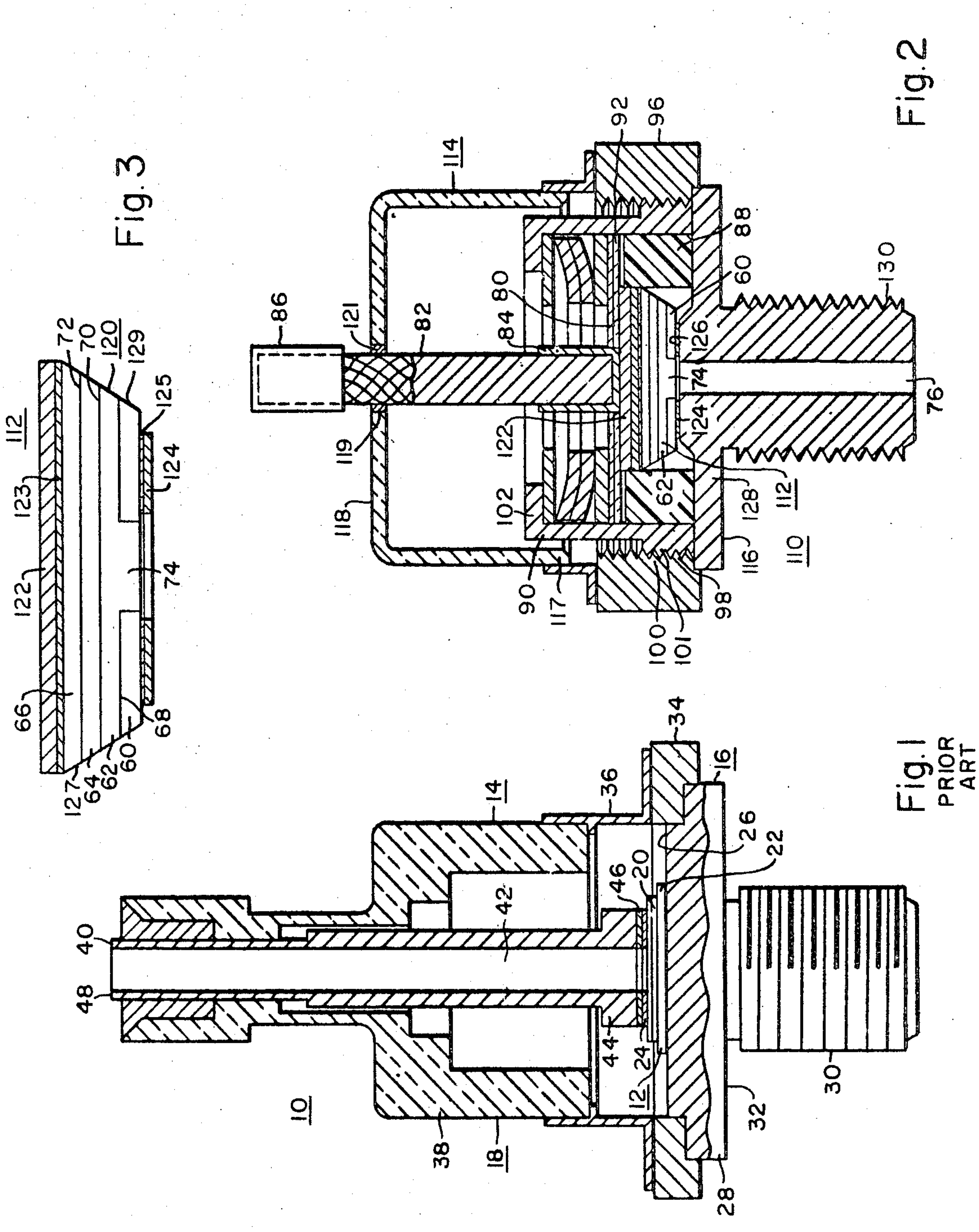
Fig. 1 PRIOR ART, Fig. 2, Fig. 3
FIG. 1 is a side view in section of a prior art light activated semiconductor device.
FIG. 2 is a side view in section of a light activated semiconductor device of this invention.
FIG. 3 is a side view of a semiconductor element suitable for use in a semiconductor device of this invention.

With reference to FIG. 2, there is shown a semiconductor device 110 made in accordance with the teachings of this invention.

The device 110 is comprised of a semiconductor element 112 hermetically sealed within a case 114 which consists of a base 116 and a cap 118.

With reference to FIG. 3, there is shown an enlarged view of the semiconductor element 112 of this invention.

The semiconductor element 112 consists of a wafer 120 of semiconductor material. The element 112 has four regions 60, 62, 64 and 66 of alternate P- and N-type semiconductivity with PN junctions 68, between regions 60 and 62, 70, between regions 62 and 64 and 72, between regions 64 and 66. Regions 60 and 66 are emitter regions and regions 62 and 64 are base regions.

A metal electrical contact 122 is hard soldered by a solder layer 123 to emitter region 66 and another metal electrical contact 124 hard soldered by solder layer 125 to emitter region 60.

Sidewalls 127 and 129 of the wafer 120 are tapered to reduce electrical breakdown.

With reference again to FIG. 2, the semiconductor element 112 is disposed on flat surface 126 of flat portion 128 of the base 116.

Electrical contact 124 is in direct physical contact with surface 126. That portion 74, of region 62 that extends to the surface of the wafer between region 60 is disposed directly over an aperture 76 which extends entirely through stud portion 130 of the base 116.

Electrical contact 122 is in direct physical contact with an electrical and thermal conductive metal member 80 which in turn is joined to a copper lead 82. Copper cup members 84 and 86 are disposed on each end of copper lead 82 to facilitate joining and contacting of the lead 82.

A spacer 88 of a suitable electrical insulating material as for example, polytetrafluoroethylene and polytrifluoromonochloroethylene is disposed about the semiconductor element 112, between the element 112 and inner case member 90 to keep the element 112 in the desired position.

At least one spacer member 92 preferably of mica or the like, in the form of washers are disposed about lead 82 and are in contact with member 80.

Compression means, as for example a plurality of Belleville Washers 94 are disposed on top of the spacer member 92.

A steel weld ring 96 is joined to flat portion 128 of the base 116. Inner wall 98 of weld ring 96 has a plurality of threads 100 thereon which engage threads 101 on the outer wall of inner case member 90.

Engaging threads 100 and 101 draws lip member 102 of the inner case member 90 against the compression mean 94, and holds electrical contact 124 in an electrical and thermal conductive relationship with flat surface 126. Electrical contact 122 is held in electrical and thermal contact with member 80 and lead 82 by the same means.

The compressive force also holds portion 74 of region 62 directly over the aperture 76 in the stud portion 130 of base member 116.

End 117 of a ceramic cap 118 is joined to the weld ring 96 and end 119 of the cap 118 is sealed about lead 82 with a glass to metal seal 121 to complete the enclosure of the semiconductor element 112 within the case.

With the insertion of an epoxy or glass layer in the aperture 76, the element 112 is hermetically sealed within the case.

In operation, the two emitter regions 60 and 64 of the element 112 are connected in an electrical circuit through the stud portion 130 of the base 116 and through electrical lead 82.

The device is fired by introducing light energy from any source as for example a base diode, by means of a light pipe or other suitable means, through the aperture to the base region 62.

While a particular cap and compression bonding arrangement has been shown it is obvious that any type cap design could be used and that the compression means can be held in compressing by any means known to those skilled in the art.

The novel features of the device of this invention as is (1) that by using compression bonding it does away with several solder connections all of which are potential points of failure, and (2) by introducing the light to the device through an aperture in the stud portion of the base of the case one is free to use any of the known compression bonding systems and any suitable cap design. Thus the device provides more flexibility in packaging than was heretofore possible.

I claim as my invention:

1. A light activated semiconductor device comprising a semiconductor element having at least three regions of opposite type semiconductivity, a case member, said semiconductor element hermetically sealed within said case member, said case member being comprised of a cap member and a base member, said cap member being joined to said base member to provide a hermetic enclosure for said element, said base member comprised of a top surface and a bottom surface, said top surface having a flat peripheral flange portion and a central flat portion, said cap member being joined to said base member along said flange portion, said bottom surface of said base member having flat peripheral flange portion and a stud portion, the walls of said stud portion forming an aperture extending entirely therethrough to said central flat surface of said top surface of said base member, said semiconductor element joined to the central flat surface of the top surface of said base member with a first region of said element disposed over said aperture, an electrically insulating spacer member disposed upon the flange portion of said top surface of said base member and surrounding said element, at least one electrical conductor held in an electrically conductive relationship with a second region of the semiconductor element by compressive means disposed within the hermetically sealed enclosure, and that portion of the stud walls surrounding said aperture forming and electrical contact for a third region of said element.